US005545916A

United States Patent [19]

Koullias

[11] Patent Number: 5,545,916

[45] Date of Patent: Aug. 13, 1996

[54] HIGH Q INTEGRATED INDUCTOR

[75] Inventor: Iconomos A. Koullias, Reading, Pa.

[73] Assignee: AT&T Corp., Murray Hill, N.J.

[21] Appl. No.: 350,439

[22] Filed: Dec. 6, 1994

[51] Int. Cl.[6] .................... H01L 29/00

[52] U.S. Cl. .................... 257/531; 336/15; 336/170; 336/223; 336/227; 336/232

[58] Field of Search .................... 257/531; 336/15, 336/20, 170, 171, 223, 227, 232

[56] References Cited

U.S. PATENT DOCUMENTS

| | | |
|---|---|---|
| 1,935,404 | 11/1933 | Leopold . |
| 3,140,458 | 7/1964 | Willecke . |
| 4,979,016 | 12/1990 | Lee . |
| 5,027,255 | 6/1991 | Zeitlin et al. . |
| 5,095,357 | 3/1992 | Andoh et al. .................... 357/51 |
| 5,206,623 | 4/1993 | Rochette et al. . |
| 5,225,969 | 7/1993 | Takaya et al. . |
| 5,233,310 | 8/1993 | Inoue . |
| 5,243,319 | 9/1993 | Brokaw . |

OTHER PUBLICATIONS

J. Y. C. Chang, et al. "Large Suspended Inductors on Silicon and Their Use in a 2-μm CMOS RF Amplifier", IEEE Electron Device Letters, vol. 14, No. 5, May 1993, pp. 246–248.

K. B. Ashby, W. C. Finley, J. J. Bastek, S. Moinian and I. A. Koullias, "High Q Inductors For Wireless Applications In a Complementary Silicon Bipolar Process", 1994 Bipolar/BiCMOS Circuits & Technology Meeting, pp. 179–182.

*Primary Examiner*—Ngân V. Ngô

[57] ABSTRACT

An inductive structure for use in high frequency integrated circuits is provided. A conductive path forming the structure is arranged so extra conductive material is located at portions of the cross-section of the conductive path where current tends to flow at high frequency.

14 Claims, 2 Drawing Sheets

$$L=\sum_{n=1}^{9} l_n$$

HIGH Q INTEGRATED INDUCTOR

BACKGROUND OF THE INVENTION

1. Field of the Invention

The present invention relates to inductors for n high frequency integrated circuits.

2. Description of the Related Art

Integrated circuits, in particular integrated circuits for wireless applications, are being driven to higher levels of integration, operation at lower supply voltages, and designs implemented for minimal power dissipation by consumer desires for low cost, small size, and long battery life. Up until this time, however, existing silicon technologies were unable to provide efficient integrable inductive structures. Losses within the semi-conducting substrate and losses due to the series resistance of the inductor's conductive path (which increase with increasing frequency of operation) were found to limit the structure's Q. The result was a limitation on a designers' ability to provide matching networks, passive filtering, inductive loading, and other inductor-based techniques on silicon integrated circuits.

Planar inductors, e.g., spiral inductors, are the type most implemented within integrated circuits. An example of a layout of a conventional integrated inductive structure is shown in FIG. 1. The key parameters in the layout of a rectangular spiral inductor are the outer dimensions of the rectangle, the width of the metal traces (i.e., conductive path), the spacing between the traces, and the number of turns in the spiral. The entire length L of the inductor's conductive path is calculated by summing each sub-length, $1_1$, $1_2$, . . . $1_N$. Fields created during operation by current flowing through the spiral pattern tends to cause the current to flow along the inner or shorter edges, i.e., the paths of least resistance. Current flow is believed, therefore, to be a key factor in observed increased resistance (and decreased Q) with increasing frequency.

Reducing the increase of series resistance within integrated inductive structures with increasing frequency has been accomplished by increasing the cross-sectional area of the conductive path. To do so, the metalization width, or thickness, or both is increased. Increasing the width of the inductor's conductive path up to a critical point tends to improve (minimize) resistance. However, beyond the critical point, improvement in Q begins to falter with increased width. Thereafter, current begins to flow in "limited" portions of the path's cross-section at higher frequencies. In particular, higher frequency currents tend to flow along the outer cross-sectional edges of the conductor, manifesting the so called "skin effect". Improving the magnetic coupling between adjacent runners or turns has also been found to produce an improved Q relative increased frequency.

SUMMARY OF THE INVENTION

The present invention provides an inductive structure for use in semiconductor integrated circuits. The inductive structure defined herein displays an inductance and Q value not realizable with conventional integrated inductor fabrication techniques.

In one form, an inductive structure is provided which is integrable with a semi-conductor integrated circuit. The inductive structure comprises an electrically continuous conductive path of length L, depth D, and width W, formed substantially as a conductive element or trace. Additional conductive material is deposited on the formed element or trace to extend the depth of conductive material an amount D' for some portion of the conductor's width W'. The location at which the additional conductive material is disposed is critical. The location must be in that portion of the inductor's conductive-path width in which the current has a tendency to flow at higher frequencies. Such positioning therefore limits the increase in series resistance with increasing frequency. Preferably, the additional conductive material extends the full length of the conductive path.

DETAILED DESCRIPTION OF THE PREFERRED EMBODIMENTS

The inductive structure of this invention displays an improved quality factor (Q) and decreased series resistance relative to conventionally designed integrated inductive structures operating at similarly high frequencies. The improvement can be accounted for by an increased cross-sectional area resulting from the deposit of additional conductive material upon the conductive path at a particular point in width W of the path. The added material increases the depth of conductive material thereat (and therefore the cross-section of the path through which current will flow) thereby minimizing resistance to current flow within the conductive path's structure with increasing frequency. The range of Q provided hereby is from about two to about 15. The range of operation at which the structures are used extends from about several hundred MHZ to beyond 10 GHz.

Figure 1:
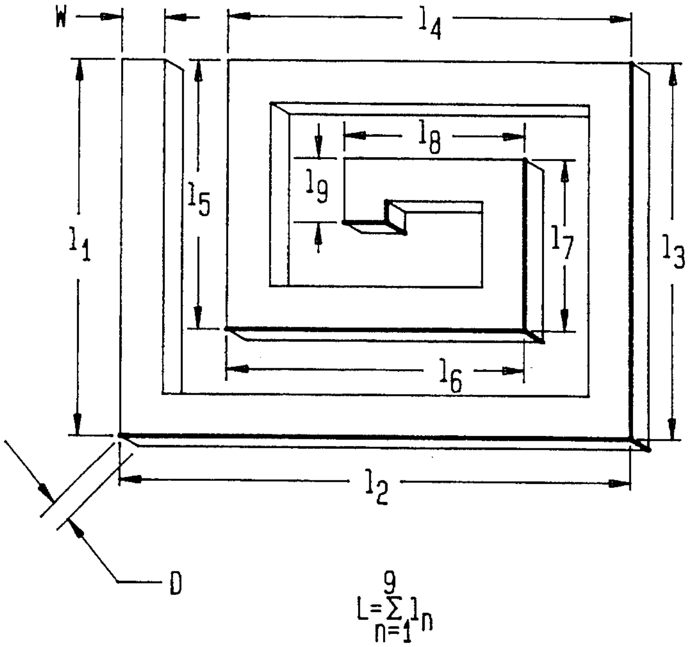
FIG. 1 (PRIOR ART)
FIG. 1 is a plan view of a portion of a spiral inductor of the prior art.
Figure 2:
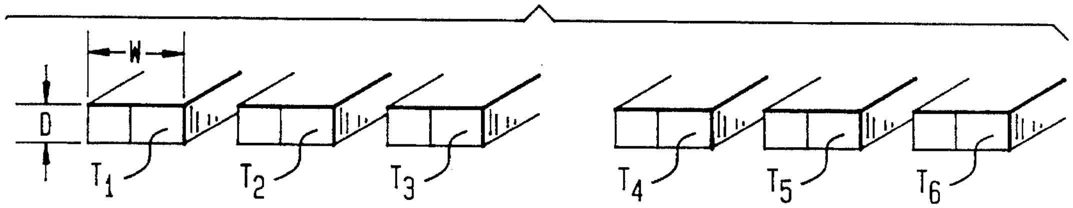
FIG. 2 (PRIOR ART)
FIG. 2 is a cross-sectional view of a portion of an inductor of the prior art.

FIGS. 2A and 2B show cross-sectional views of a portion of an integrated inductive structure conventionally formed. The cross-section of each of metal traces $T_1$–$T_6$ (forming portions of the continuous conductive path of the structure) is calculated as W×D. At higher frequencies, current flow tends to be limited to the cross-sectional areas (based on current flow direction) shown hatched in the figure. The cross-section of the metal traces may be increased by adding conductive material upon the surface to increase the depth D by an amount D' and width W'.

Figure 3A:
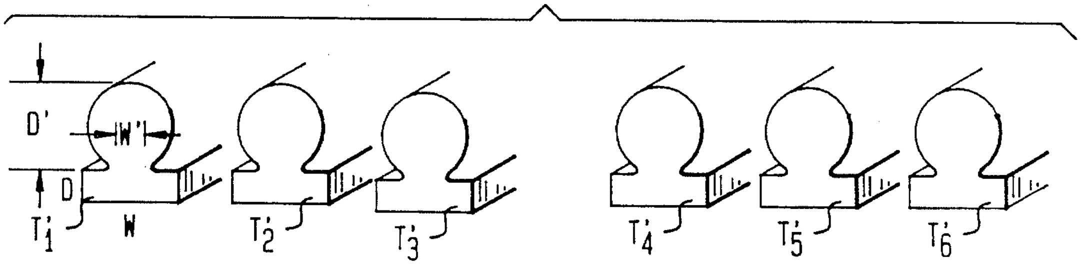
FIG. 3A (PRIOR ART)
FIG. 3A is a cross-sectional view of a portion of an inductor of the prior art to which additional conductive material has been added.
Figure 3B:
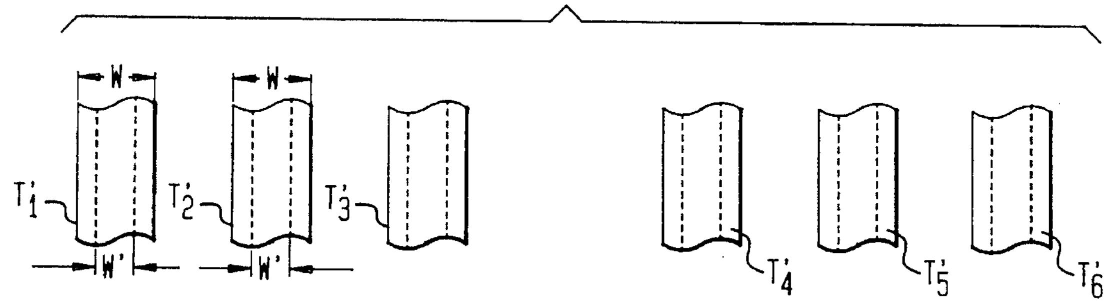
FIG. 3B (PRIOR ART)
FIG. 3B is a plan view of the portion of FIG. 3A.

FIGS. 3A and 3B show cross-sectional and plan views, respectively, of several metal traces, $T_1'$, $T_2'$, . . . $T_6'$, forming an inductive structure with conductive material added. As can be seen, adding conductive material (e.g., gold) to increase D by an amount D' tends to cause a mushrooming or width expansion with increased depth beyond the intended width W'. To avoid conduction and arcing across the mushroomed portions of added material i.e., mushrooming material, the increased depth must be limited. This limits the ability of a designer to increase the cross-sectional area of the conductive path. The hatched portions of traces shown in FIG. 3A highlight the cross-sectional trace portions where current tends to flow at higher frequencies. As can be seen, substantial current flow is limited to an area of the added conductive material for the same reasons discussed above with reference to the cross-section shown in FIG. 2.

The structure of the present invention offsets the added conductive material, relative the width of the runner or trace so that its added depth D' at width W' (and additional cross-section) is increased only relative the portion through which most current tends to flow at higher frequencies. In other words, the efficiency of the addition of the conductive material is maximized in the present design by its location relative the width W of the existing trace. By positioning W' relative to W, the "effective" cross-section of the trace is now maximized for maximum conductance with increasing frequency.

Figure 4A:
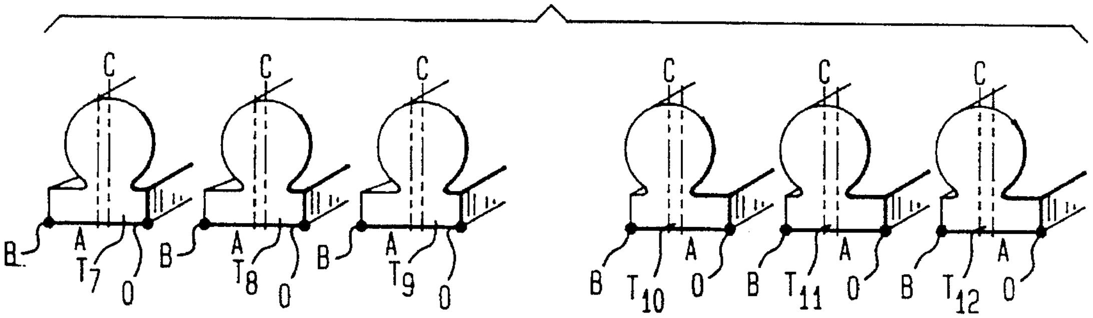
FIG. 4A is a cross-sectional view of a portion of an inductor formed according to this invention.
Figure 4B:
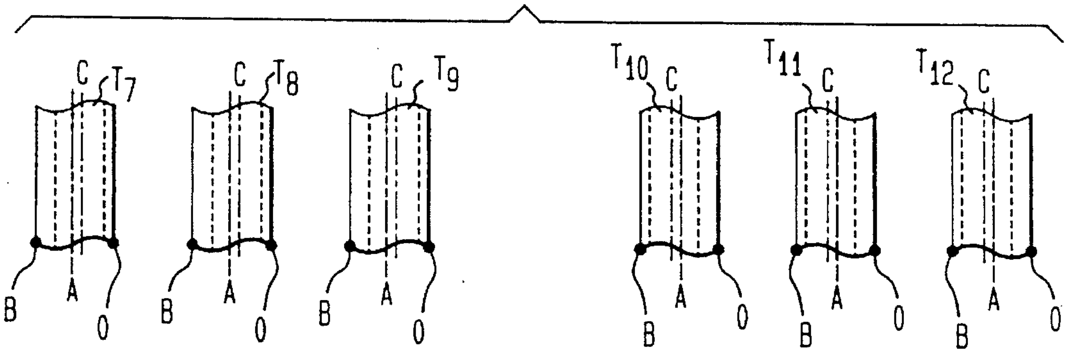
FIG. 4B is a plan view of a portion of the inductor of FIG. 4A.

FIGS. 4A and 4B show cross-sectional and plan views, respectively, of a portion of a conductive path of an inductive structure of this invention comprised of metal traces $T_7$–$T_{12}$. The outermost edge of each trace $T_7$–$T_{12}$ is arbitrarily identified as O. The direct opposite edge of the width W of each trace is defined as point B. The midpoint between a line $\overline{OB}$ formed between the edges is defined as point A. The midpoint of a line crossing the width W' of the added material is identified as point C. As can be seen in both FIGS. 4A and 4B, the added material is closer to the edge of width W where the current tends to flow at higher frequencies, i.e., the shorter edges relative to positioning within the spiral.

In the traces identified as $T_{10}$, $T_{12}$ and $T_{12}$, the current tends to flow nearer the edge identified as B, with point C located between point A and edge B. Edge B is the innermost edge (i.e., with the "shorter" overall length L relative to edge O) of the trace. Because current tends to flow at high frequency at the innermost portions of the trace, it follows that the current will tend to flow in more of the added cross-sectional area (W'×D') than the area as arranged in the structural positioning of the added material shown in FIGS. 3A and 3B. In the traces identified as $T_7$, $T_8$ and $T_9$, the current tends to flow along the edge identified as O (because of the opposite direction of current flow relative traces $T_{10}$, $T_{11}$ and $T_{12}$). Point C within added width W' therefore, exists between edge O and point A, the innermost or shortest edge of traces $T_7$, $T_8$ and $T_9$. The added material is maximized for current flow at higher frequencies thereby.

What has been described herein is merely illustrative of the application of the principles of the present invention. Other arrangements and methods may implemented by those skilled in the art without departing from the spirit and scope of this invention.

What is claimed is:

1. An inductive structure integrable with a semi-conductor integrated circuit, comprising:

an electrically continuous conductive path of depth D and width W, disposed in a spiral pattern upon a substrate conductive material of width W' and depth D', where W>W' been added to a surface corresponding to said width W of said conductive path whereby W's centerline is offset from Ws centerline such that a series resistance to current flowing through said structure is not substantially increased at any one frequency relative to said portion of conductive material not being added, during high frequency operation of at least 100 MHz.

2. The inductive structure defined by claim 1, wherein said added portion at width W' and depth D' extends the entire length L of said conductive path.

3. The inductive structure defined by claim 1, wherein said width W extends directly from one edge of said conductive path identified as O to an opposite edge of said width of said conductive path identified as B, wherein a point A defines a midpoint of a line $\overline{OB}$ between edges O and B, and wherein a midpoint of the width W' of said added portion is located at a point C within a line extending between point A and edge B, where a total length L' of said path at edge B is shorter than a total length L of said path at edge O.

4. The inductive structure defined by claim 1, wherein said structure operates within a high frequency range of from about 100 MHz to about 10 GHz.

5. The inductive structure defined by claim 4, wherein said structure operates at a Q within a range of 2 to 15.

6. The inductive structure defined by claim 5, wherein said Q is approximately 12.

7. The inductive structure defined by claim 1, wherein said substrate material is one of: an insulating material, a dielectric material and a semi-conductor material.

8. An integrated circuit formed on a substrate material that includes an inductive structure, said inductive structure comprising an electrically continuous path of depth D and width W, disposed in a spiral pattern upon said substrate, wherein a portion of conductive material of width W' depth D', where W>W', has been added to a surface corresponding to width W of said conductive path whereby W's centerline is offset from Ws centerline such that a quality factor Q of said structure is not substantially degraded relative to said portion of conductive material not being added at any one frequency during high frequency operation of at least 100 MHz.

9. The integrated circuit defined by claim 8, wherein said added portion at width W' and depth D' extends the entire length L of said conductive path.

10. The integrated circuit defined by claim 8, wherein said width W extends directly from one edge of said conductive path identified as O, to an opposite edge of said width of said conductive path identified as B, and wherein a point A defines a midpoint of a line $\overline{OB}$ extending between edges 0 and B, and a midpoint C within the width W' of said added portion is located within a line extending between point A and edge B, wherein a total length L' of edge B is shorter than a total length L of said path edge O.

11. The integrated circuit defined by claim 8, wherein said circuit is deigned for use within a frequency range of from about 100 MHz to about 10 GHz.

12. The integrated circuit defined by claim 11, wherein said structure operates at a Q within a range of 2 to 15.

13. The integrated circuit defined by claim 12, wherein said Q is approximately 12.

14. The integrated circuit defined by claim 8, wherein said substrate material is one of: an insulating material, a semiconducting material and a dielectric material.

* * * * *